United States Patent
Wang et al.

(10) Patent No.: US 11,404,250 B2
(45) Date of Patent: Aug. 2, 2022

(54) PLASMA ETCHER EDGE RING WITH A CHAMFER GEOMETRY AND IMPEDANCE DESIGN

(71) Applicant: Taiwan Semiconductor Manufacturing Company Limited, Hsinchu (TW)

(72) Inventors: Chien-Yu Wang, Hsinchu (TW); Hung-Bin Lin, New Taipei (TW); Shih-Ping Hong, Hsinchu County (TW); Shih-Hao Chen, Zhubei (TW); Chen-Hsiang Lu, Hsin-Chu (TW); Ping-Chung Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/946,825

(22) Filed: Jul. 8, 2020

(65) Prior Publication Data
US 2022/0013337 A1 Jan. 13, 2022

(51) Int. Cl.
| H01J 37/32 | (2006.01) |
| H01L 21/3065 | (2006.01) |
| H01L 21/67 | (2006.01) |
| H01L 21/683 | (2006.01) |
| H01L 21/687 | (2006.01) |

(52) U.S. Cl.
CPC .. *H01J 37/32642* (2013.01); *H01J 37/32715* (2013.01); *H01L 21/3065* (2013.01); *H01L 21/67069* (2013.01); *H01L 21/6831* (2013.01); *H01L 21/68735* (2013.01); *H01J 2237/2007* (2013.01); *H01J 2237/334* (2013.01)

(58) Field of Classification Search
CPC .......... H01J 37/32642; H01J 37/32715; H01J 2237/2007; H01J 2237/334; H01J 37/32623; H01L 21/6831; H01L 21/68735; H01L 21/67069; H01L 21/3065
USPC .............. 156/345.14, 345.19, 345.3, 345.33, 156/345.23, 345.51; 438/706, 710, 712, 438/714
See application file for complete search history.

(56) References Cited

U.S. PATENT DOCUMENTS

| 10,879,041 | B2* | 12/2020 | Ye | H01J 37/32082 |
| 2011/0272100 | A1* | 11/2011 | Koshiishi | H01J 37/32642 156/345.43 |
| 2015/0170925 | A1* | 6/2015 | Chen | H01J 37/32642 438/758 |
| 2017/0330734 | A1* | 11/2017 | Lee | H01J 37/32642 |

* cited by examiner

*Primary Examiner* — Lan Vinh
(74) *Attorney, Agent, or Firm* — Harrity & Harrity, LLP

(57) ABSTRACT

An edge ring, for a plasma etcher, may include a circular bottom portion with an opening sized to receive an electrostatic chuck supporting a semiconductor device, and a circular top portion integrally connected to a first top part of the circular bottom portion. The edge ring may include a circular chamfer portion integrally connected to a second top part of the circular bottom portion and integrally connected to a side of the circular top portion. The circular chamfer portion may include an inner surface that is angled radially outward from the opening at less than ninety degrees.

20 Claims, 12 Drawing Sheets

PLASMA ETCHER EDGE RING WITH A CHAMFER GEOMETRY AND IMPEDANCE DESIGN

BACKGROUND

A plasma etcher, or etching tool, is a tool used in the production of semiconductor devices. A plasma etcher produces a plasma from a process gas (e.g., an oxygen-bearing gas, a fluorine-bearing gas, and/or the like) using a high frequency electric field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
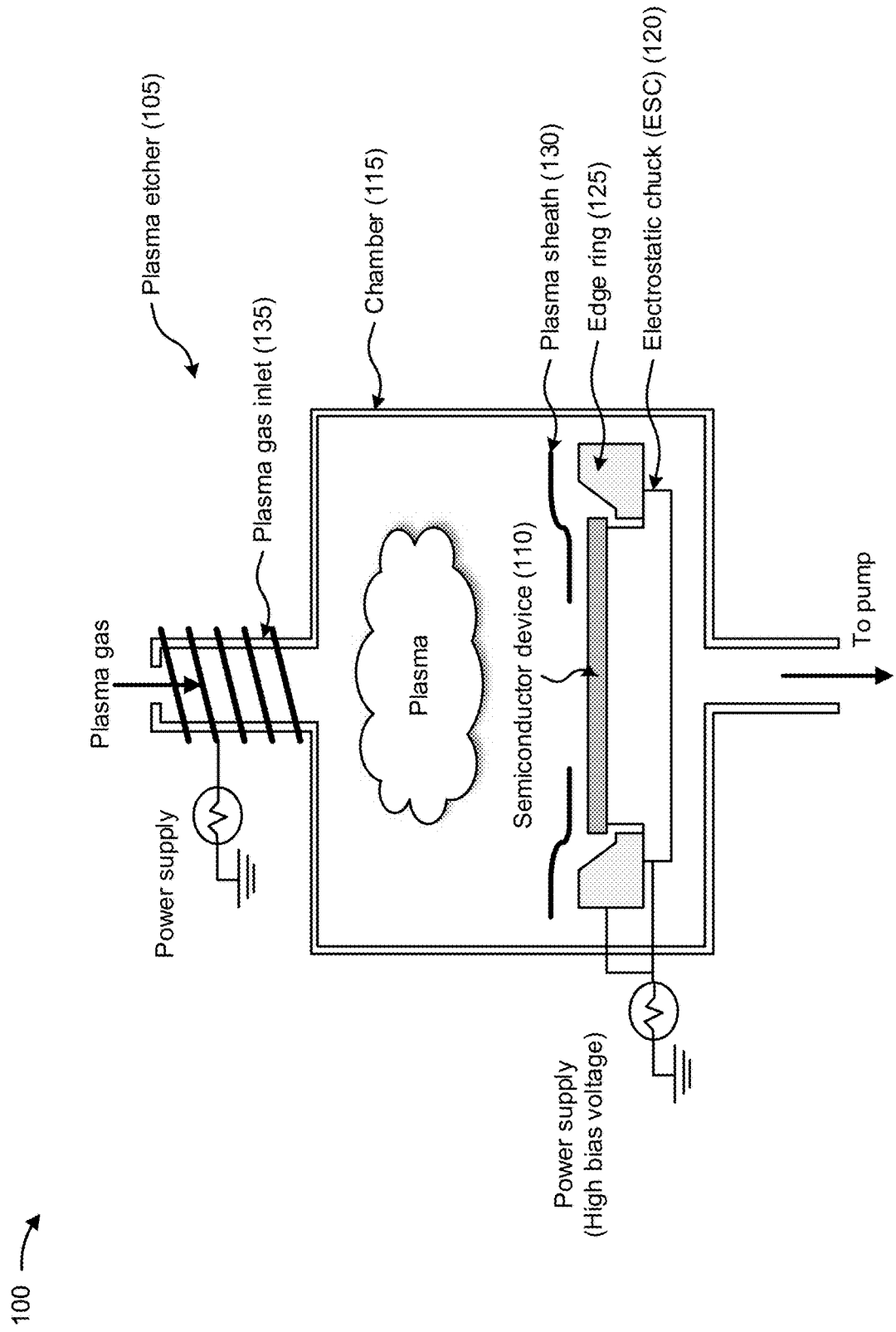
FIGS. 1A-1D are diagrams of an example implementation of a plasma etcher and an edge ring for the plasma etcher described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, a plasma etcher may perform plasma etching to fabricate semiconductor devices. Plasma etching involves a high-speed stream of glow discharge (e.g., a plasma) of an appropriate gas mixture being provided in pulses to a semiconductor device. A plasma source, known as an etch species, can be either charged (e.g., ions) or neutral (e.g., atoms and radicals). During plasma etching, the plasma generates volatile etch products from chemical reactions between elements of a material to be etched and reactive species generated by the plasma. Eventually, atoms of the plasma embed themselves at or just below a surface of a target (e.g., the semiconductor device), thus modifying physical properties of the target.

An edge ring is a component of a plasma etcher that surrounds a semiconductor device provided on an electrostatic chuck of the plasma etcher. The edge ring provides electrical and plasma fluid uniformity for the semiconductor device, while the semiconductor device is being processed by the plasma etcher. A high bias voltage is applied to the edge ring so that the edge ring may provide the electrical and plasma uniformity. However, the high bias voltage causes current edge rings to erode quickly and to require replacement. Replacing current edge rings requires shutting down plasma etchers, which may significantly impact manufacturing throughput of semiconductor devices. Furthermore, current edge rings (e.g., due to erosion) may cause vias, provided between two metal layers of a semiconductor device, to shift and affect performance of the semiconductor device.

According to some implementations described herein, a semiconductor device may be generated by a plasma etcher and an edge ring with a chamfer geometry and impedance design. For example, the edge ring may include a circular bottom portion with an opening sized to receive an electrostatic chuck supporting a semiconductor device, and a circular top portion integrally connected to a first top part of the circular bottom portion. The edge ring may include a circular chamfer portion integrally connected to a second top part of the circular bottom portion and integrally connected to a side of the circular top portion. The circular chamfer portion may include an inner surface that is angled radially outward from the opening at less than ninety degrees.

In this way, the edge ring increases an impedance generated by the edge ring, which reduces sensitivity of the edge ring to the plasma etching process and reduces an erosion rate of the edge ring. The reduced erosion rate enables the plasma etcher to operate for longer periods of time, increases manufacturing throughput, and reduces replacement costs associated with operating the plasma etcher. Furthermore, the chamfer geometry of the edge ring improves control of a plasma ion angle effect of the plasma etcher and ensures that the plasma contacts the semiconductor device during the plasma etch. This reduces process sensitivity and improves quality control for the semiconductor device by preventing vias of the semiconductor device from unwantedly shifting during the plasma etching process.

FIGS. 1A-1D are diagrams of an example implementation 100 of a plasma etcher and an edge ring for the plasma etcher described herein. As shown in FIG. 1A, a plasma etcher 105 may process a semiconductor device 110 and may include a chamber 115, an electrostatic chuck (ESC) 120, an edge ring 125, a plasma sheath 130, and a plasma gas inlet 135.

Plasma etcher 105 is a semiconductor processing tool that removes materials from a surface of semiconductor device 110. In some implementations, a portion of semiconductor device 110 is protected from an etchant by a masking material that resists etching. For example, the masking material may include a photoresist that is patterned using photolithography. Plasma etcher 105 may perform a dry (e.g., plasma) etching process on semiconductor device 110. The plasma etching process may operate in several modes based on adjusting parameters of the plasma. The plasma produces energetic free radicals, that are neutrally charged and that react at a surface of semiconductor device 110. Plasma etching may be isotropic (e.g., exhibiting a lateral undercut rate on a patterned surface approximately the same as a downward etch rate) or anisotropic (e.g., exhibiting a smaller lateral undercut rate than the downward etch rate).

Chamber 115 may include a chamber to receive a plasma gas and to process semiconductor device 110 with the plasma gas. Chamber 115 may be sized and shaped depending on a size and a shape of semiconductor device 110 to be processed by plasma etcher 105. Chamber 115 may be box-shaped to aid in the plasma etching process, but may be other shapes, such as cylindrical, spherical, and/or the like. In some implementations, chamber 115 is constructed of a material or materials that are resistant to abrasion and/or corrosion caused by materials used to generate the plasma. For example, chamber 115 may be constructed of a metal, such as aluminum, stainless steel, and/or the like. In some implementations, chamber 115 includes walls with thicknesses that provide a rigid structure capable of supporting components within chamber 115 and of containing the plasma gas under pressure.

Electrostatic chuck 120 may include a component that generates an attracting force between electrostatic chuck 120 and semiconductor device 110 based on a voltage applied to electrostatic chuck 120. The voltage may be provided from a power supply that provides a high bias voltage to electrostatic chuck 120. The attractive force may cause semiconductor device 110 to be retained on and supported by electrostatic chuck 120, during processing of semiconductor device 110. Electrostatic chuck 120 may be sized and shaped depending on a size and a shape of semiconductor device 110 to be processed by plasma etcher 105. For example, electrostatic chuck 120 may be circular shaped and may support all or a portion of a circular shaped semiconductor device 110. In some implementations, electrostatic chuck 120 is constructed of a material or materials that are resistant to abrasion and/or corrosion caused by materials used to generate the plasma, and that can generate the attractive force between electrostatic chuck 120 and semiconductor device 110. For example, chamber 115 may be constructed of a metal, such as aluminum, stainless steel, and/or the like.

Edge ring 125 may include a component that surrounds semiconductor device 110 provided on electrostatic chuck 120 of plasma etcher 105. Edge ring 125 provides electrical and plasma fluid uniformity for semiconductor device 110, while semiconductor device 110 is being processed by plasma etcher 105. A high bias voltage is applied to edge ring 125 (e.g., from a power supply) so that edge ring 125 may provide the electrical and plasma uniformity. Edge ring 125 may be sized and shaped depending on a size and a shape of semiconductor device 110 to be processed by plasma etcher 105. For example, edge ring 125 may be circular shaped and may include an opening to enable edge ring 125 to surround semiconductor device 110 and electrostatic chuck 120. In some implementations, edge ring 125 is constructed of a material or materials that are resistant to abrasion and/or corrosion caused by materials used to generate the plasma, and that can provide the electrical and plasma uniformity for semiconductor device 110. For example, edge ring 125 may be constructed of a metal, such as aluminum, stainless steel, and/or the like. Further details of edge ring 125 are provided below in connection with FIGS. 1B-1D and 3A-3E.

Plasma sheath 130 is a component that is sized and shaped to maintain the plasma adjacent to a surface of semiconductor device 110 during processing of semiconductor device 110 by plasma etcher 105. In some implementations, plasma sheath 130 is sized and shaped based on a size and a shape of plasma etcher 105, a size and a shape of semiconductor device 110 processed by plasma etcher 105, and/or the like. For example, plasma sheath 130 may be circular shaped and may include an opening to enable the plasma to reach the surface of semiconductor device 110. In some implementations, plasma sheath 130 is constructed of a material or materials that are resistant to abrasion and/or corrosion caused by materials used to generate the plasma, and that can maintain the plasma adjacent to the surface of semiconductor device 110. For example, plasma sheath 130 may be constructed of a metal, such as aluminum, stainless steel, and/or the like.

Plasma gas inlet 135 may include an opening in chamber 115 that permits a plasma gas to be provided to chamber 115. The plasma gas may be a source gas for the plasma that includes small molecules rich in chlorine or fluorine. For example, carbon tetra fluorine may be utilized as the plasma gas to etch silicon and chlorine may be utilized as the plasma gas to etch aluminum, trifluoro methane may be used to etch silicon dioxide and silicon nitride, and/or the like. The plasma gas may also include oxygen that is used to oxidize a photoresist and facilitate removal of the photoresist. In some implementations, the plasma gas is converted to the plasma based on applying a high frequency electric field (e.g., provided by a power supply) to the plasma gas via the plasma gas inlet 135.

In operation, plasma etcher 105 may produce a plasma from the plasma gas using the high frequency electric field. Semiconductor device 110 may be placed in plasma etcher 105, and air may be evacuated from chamber 115 using one or more vacuum pumps. The plasma gas may be introduced at low pressure into chamber 115 via plasma gas inlet 135. The plasma gas may be excited into the plasma through dielectric breakdown. The plasma may produce energetic free radicals, that are neutrally charged and that react at the surface of semiconductor device 110 and etch the surface. The plasma etching may be isotropic (e.g., exhibiting a lateral undercut rate on a patterned surface approximately the same as a downward etch rate) or anisotropic (e.g., exhibiting a smaller lateral undercut rate than the downward etch rate).

Figure 1B:
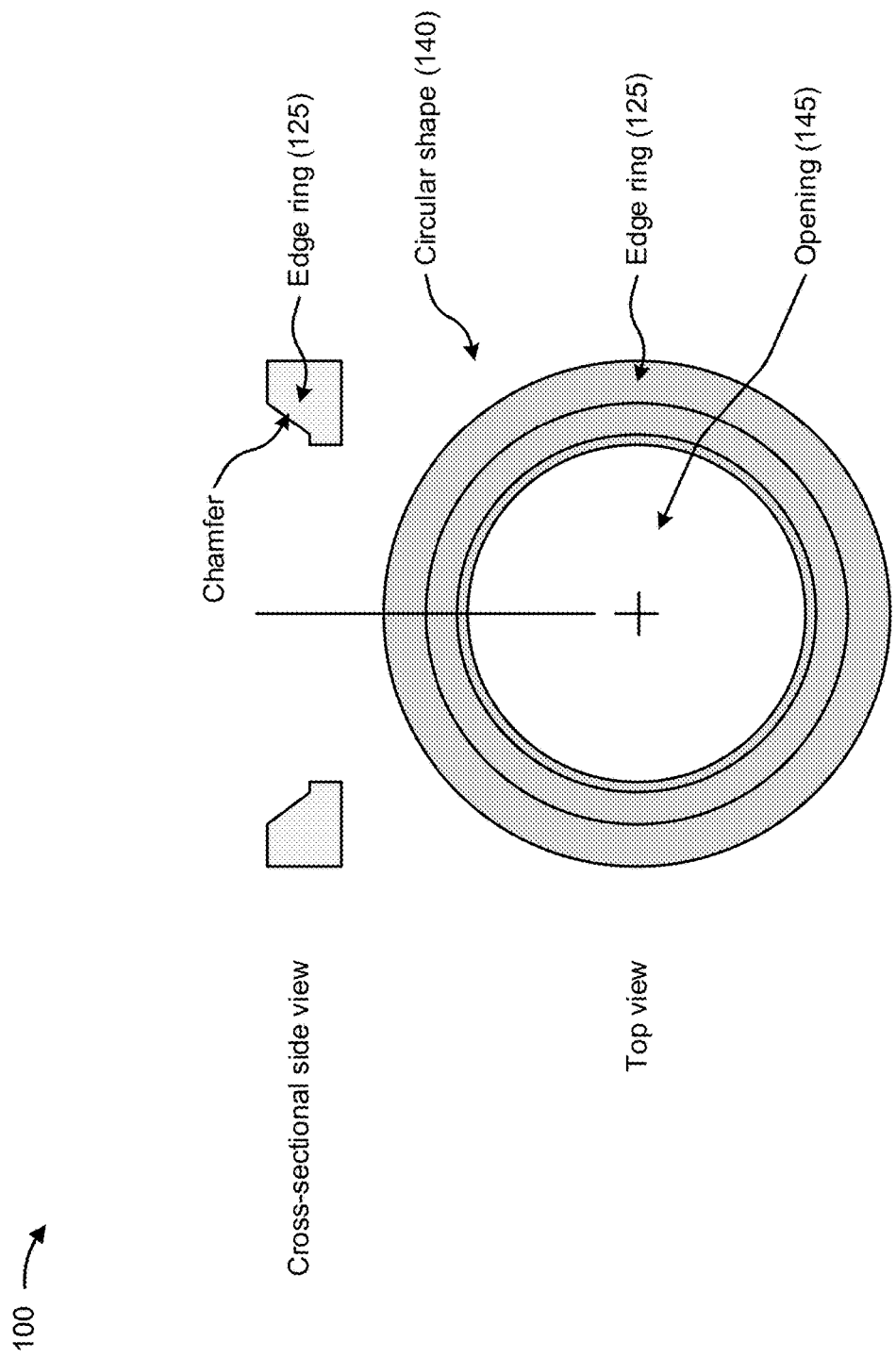

FIG. 1B provides a cross-sectional view and a top view of edge ring 125. As shown in the cross-sectional view, edge ring 125 may include a chamfer portion (e.g., described in connection with FIG. 1D) with a surface that is angled radially outward from a center portion of edge ring 125. As shown in the top view, and by reference number 140, edge ring 125 includes a circular shape with an opening 145. Opening 145 may enable edge ring 125 to surround semiconductor device 110 and electrostatic chuck 120. The surface of the chamfer portion may be angled radially outward from opening 145.

Figure 1C:
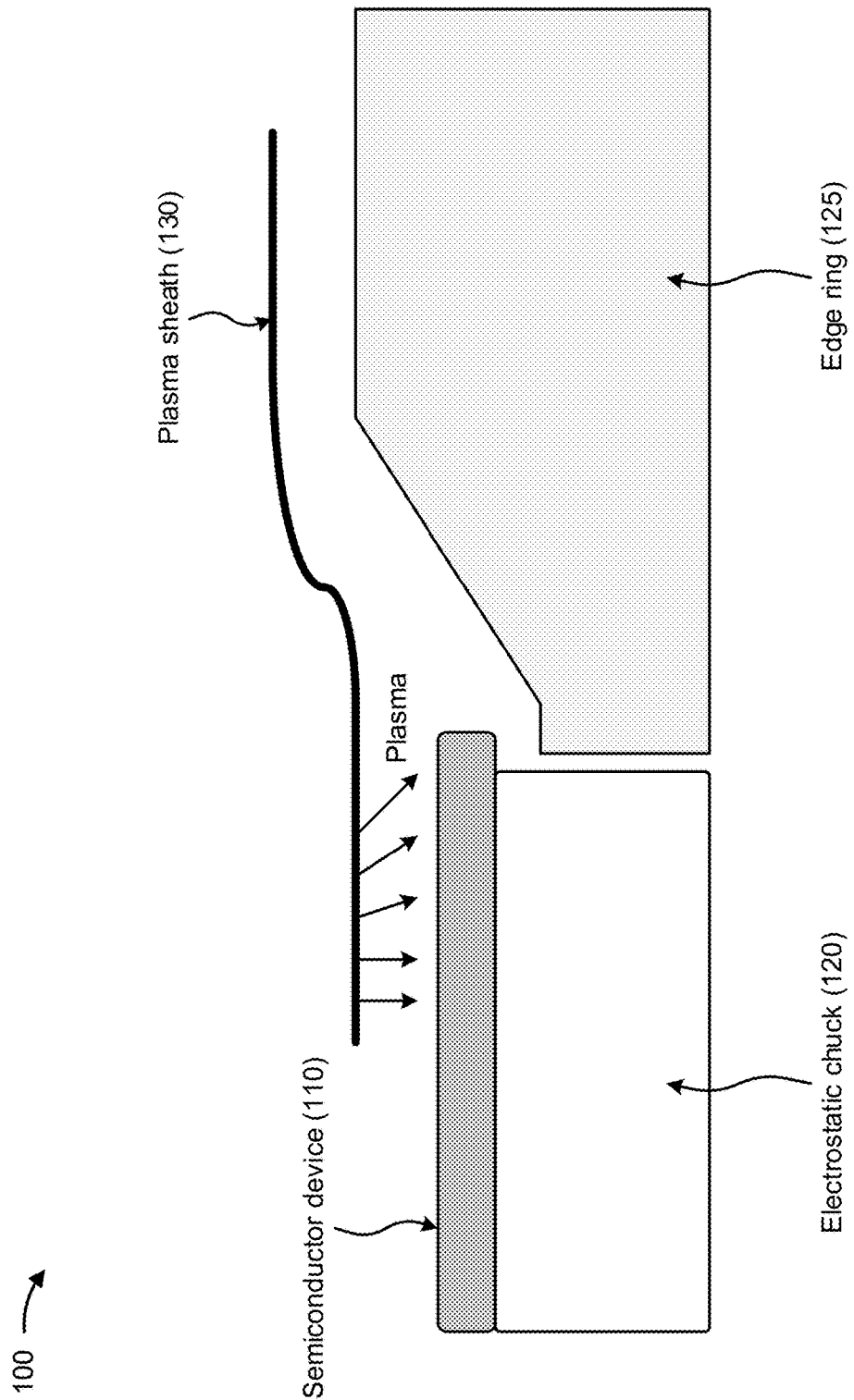

FIG. 1C is a cross-sectional view of portions of semiconductor device 110, electrostatic chuck 120, edge ring 125, and plasma sheath 130. As shown, edge ring 125 may be provided around peripheries of semiconductor device 110 and electrostatic chuck 120. Edge ring 125 and plasma sheath 130 may ensure that the plasma is maintained adjacent to the surface of semiconductor device 110. In this way, edge ring 125 and plasma sheath 130 may ensure that the plasma processes (e.g., etches) the surface of semiconductor device 110 in a uniform manner and without damaging semiconductor device 110.

Figure 1D:
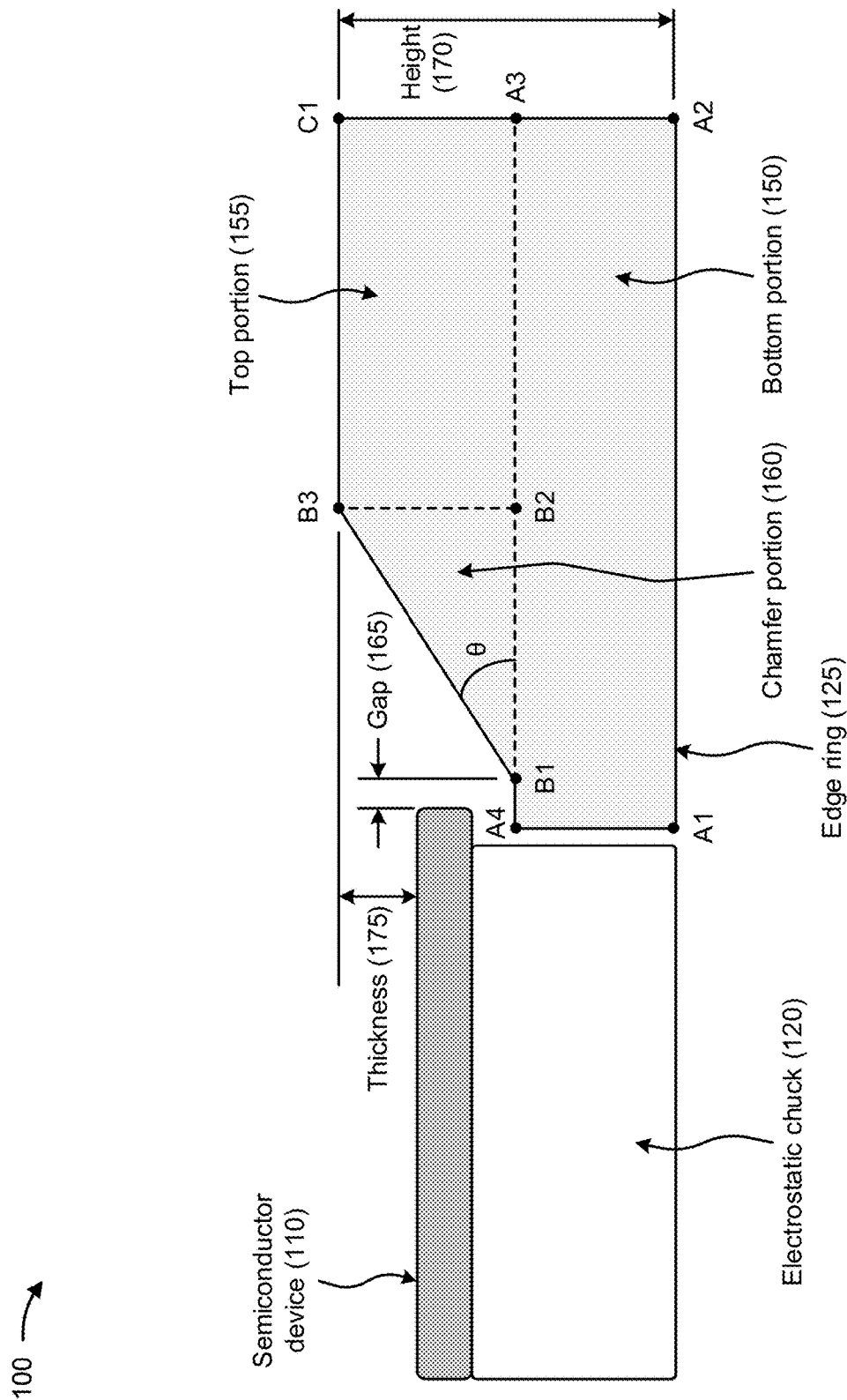

FIG. 1D is a cross-sectional view of portions of semiconductor device 110, electrostatic chuck 120, and edge ring 125. As shown, edge ring 125 may include a bottom portion 150, a top portion 155, and a chamfer portion 160. Bottom portion 150, top portion 155, and chamfer portion 160 may integrally formed from a material (e.g., aluminum, stainless steel, and/or the like) to create edge ring 125. Bottom portion 150 may be rectangular shaped, as defined by points A1, A1, A3, and A4 in FIG. 1D. Top portion 155 may be rectangular shaped, as defined by points B2, A3, C1, and B3 of FIG. 1D. Chamfer portion 160 may be triangular shaped, as defined by points B1, B2, and B3 and an angle θ in FIG. 1D. An inner surface of chamfer portion 160 (e.g., defined by points B1 and B3) may be angled radially outward from the opening of edge ring 125 by angle θ.

In some implementations, a geometry of edge ring 125 is different than geometries of current edge rings. For example, geometries of current edge rings do not include chamfer portions. Thus, bottom portions and top portions of current edge rings create angles of ninety degrees relative to openings of current edge rings. Furthermore, heights of current edge rings are shorter than a height of edge ring 125, and distances between top portions of current edge rings and edges of semiconductor devices are greater than a distance between chamfer portion 160 of edge ring 125 and edges of semiconductor device 110. In this way, the geometry of edge ring 125 increases an impedance generated by edge ring 125 over current edge rings, which reduces sensitivity of edge ring 125 to the plasma etching process and reduces an erosion rate of edge ring 125. The reduced erosion rate enables plasma etcher 105 to operate for longer periods of time (e.g., before servicing), increases manufacturing throughput, and reduces replacement costs associated with operating plasma etcher 105. Furthermore, the geometry of edge ring 125 improves control of a plasma ion angle effect of plasma etcher 105 and ensures that the plasma contacts semiconductor device 110 during the plasma etch. This reduces process sensitivity and improves quality control for semiconductor device 110 by preventing vias of semiconductor device 110 from unwantedly shifting during the plasma etching process, as described below in connection with FIG. 2.

In some implementations, angle θ of chamfer portion 160 may be less than ninety degrees, may be in a range from approximately ten degrees to approximately seventy degrees (e.g., θ=40°±30°), may be in a range from approximately thirty degrees to approximately fifty degrees (e.g., θ=40°±10°), and/or other ranges within the scope of this disclosure. The angle θ of chamfer portion 160 may reduce via profile shifting of semiconductor device 110 and may increase hours of operation for plasma etcher 105 (e.g., by reducing down time of plasma etcher 105), as described below in connection with FIG. 3E. For example, an angle θ of less than ninety degrees may increase hours of operation for plasma etcher 105 less than an angle θ in a range from approximately ten degrees to approximately seventy degrees; and an angle θ in a range from approximately ten degrees to approximately seventy degrees may increase hours of operation for plasma etcher 105 less than an angle θ in a range from approximately thirty degrees to approximately fifty degrees. In another example, an angle θ of less than ninety degrees may reduce via profile shifting of semiconductor device 110 less than an angle θ in a range from approximately ten degrees to approximately seventy degrees; and an angle θ in a range from approximately ten degrees to approximately seventy degrees may reduce via profile shifting of semiconductor device 110 less than an angle θ in a range from approximately thirty degrees to approximately fifty degrees.

As further shown in FIG. 1D, a gap 165 (e.g., a distance) between point B1 of chamfer portion 160 and an edge of semiconductor device 110 may be in a range from approximately zero millimeters (mm) to approximately two millimeters (e.g., gap=1±1 mm), may be in a range from approximately zero millimeters to approximately four millimeters (e.g., 2±2 mm), and/or other ranges within the scope of this disclosure. Gap 165 may reduce via profile shifting of semiconductor device 110 and may increase hours of operation for plasma etcher 105 (e.g., by reducing down time of plasma etcher 105), as described below in connection with FIG. 3D. For example, gap 165 in a range from approximately zero millimeters to approximately four millimeters may increase hours of operation for plasma etcher 105 less than gap 165 in a range from approximately zero millimeters to approximately two millimeters. In another example, gap 165 in a range from approximately zero millimeters to approximately four millimeters may reduce via profile shifting of semiconductor device 110 less than gap 165 in a range from approximately zero millimeters to approximately two millimeters.

As further shown in FIG. 1D, a thickness of bottom portion 150 (e.g., defined by points A2 and A3) and a thickness of top portion 155 (e.g., defined by points A3 and C1) may define a height 170 of edge ring 125. A thickness 175 (e.g., as distance) between height 170 of edge ring 125 and a top surface of semiconductor device 110 may be in a range from approximately zero millimeters to approximately 1.5 millimeters (e.g., 0.75±0.75 mm), may be in a range from approximately zero millimeters to approximately 3.75 millimeters (e.g., 0.75±3 mm), and/or other ranges within the scope of this disclosure. Thickness 175 may reduce via profile shifting of semiconductor device 110 and may increase hours of operation for plasma etcher 105 (e.g., by reducing down time of plasma etcher 105), as described below in connection with FIG. 3C. For example, thickness 175 in a range from approximately zero millimeters to approximately 3.75 millimeters may increase hours of operation for plasma etcher 105 less than thickness 175 in a range from approximately zero millimeters to approximately 1.5 millimeters. In another example, thickness 175 in a range from approximately zero millimeters to approximately 3.75 millimeters may reduce via profile shifting of semiconductor device 110 less than thickness 175 in a range from approximately zero millimeters to approximately 1.5 millimeters.

As indicated above, FIGS. 1A-1D are provided merely as one or more examples. Other examples may differ from what is described with regard to FIGS. 1A-1D.

Figure 2:
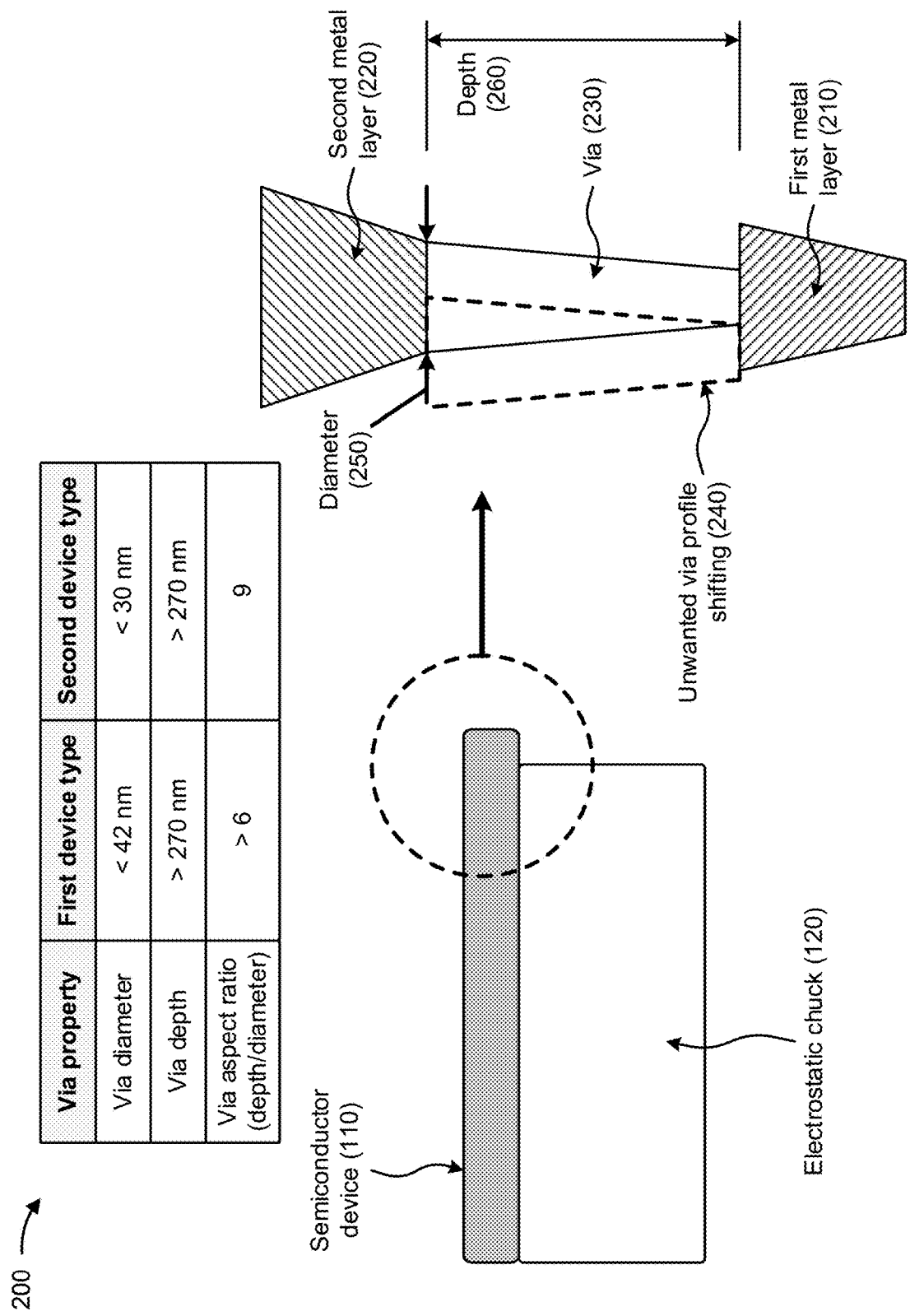
FIG. 2 is a diagram of an example implementation of a portion of a semiconductor device generated using the plasma etcher and the edge ring described herein.

FIG. 2 is a diagram of an example implementation 200 of a portion of semiconductor device 110 generated using plasma etcher 105 and edge ring 125 described herein. As shown, an edge portion of semiconductor device 110 may include a first metal layer 210, a second metal layer 220, and a via 230 to connect first metal layer 210 and second metal layer 220. Plasma etcher 105 with edge ring 125 may generate via 230 (shown in solid lines in FIG. 2) that aligns with first metal layer 210 and second metal layer 220. As further shown in FIG. 2, and by reference number 240, plasma etchers utilizing current edge rings will produce a shifted via profile (shown in dashed lines in FIG. 2), that is not aligned with first metal layer 210 and second metal layer 220, due to erosion of the current edge rings. Such a misalignment may cause semiconductor device 110 to malfunction, to not function at all, and/or the like.

As further shown in FIG. 2, via 230 may include a diameter (or width) 250 and a depth 260. Different types of semiconductor devices may include different via properties, as shown in the table of FIG. 2. For example, a first type of semiconductor device 110 may include a via diameter 250 of less than forty-two nanometers (nm), and a second type of semiconductor device 110 may include a via diameter 250 of less than thirty nanometers. Both the first type and the second type of semiconductor device 110 may include a via depth 260 of more than two-hundred and seventy nanometers. Thus, the first type of semiconductor device 110 may include a via aspect ratio (e.g., which equals the via depth divided by the via diameter) of more than six, and the second type of semiconductor device 110 may include a via aspect ratio of nine.

As indicated above, FIG. 2 is provided merely as one or more examples. Other examples may differ from what is described with regard to FIG. 2.

Figure 3A:
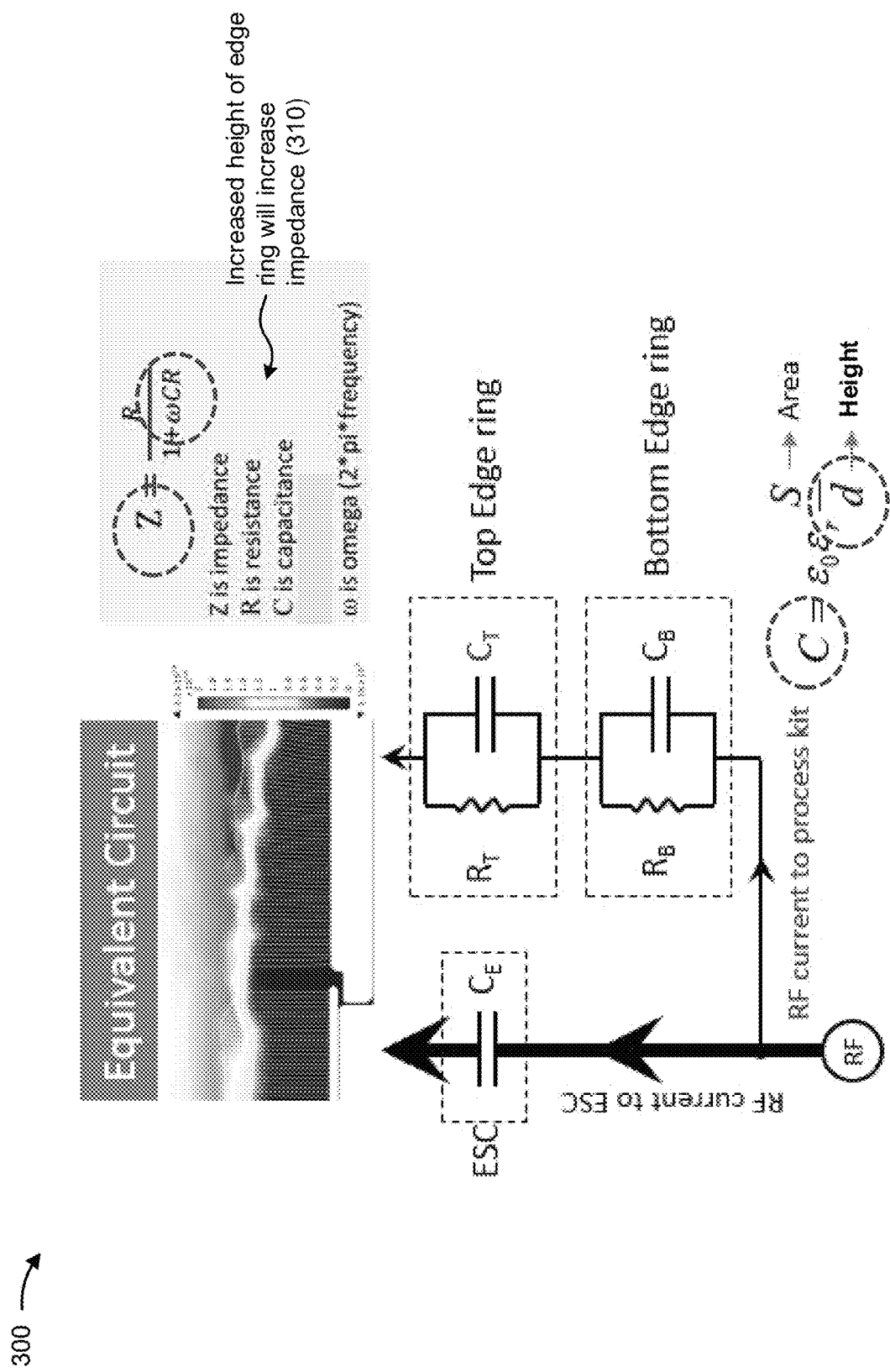
FIGS. 3A-3E are diagrams of example features associated with the plasma etcher and the edge ring described herein.

FIGS. 3A-3E are diagrams 300 of example features associated with plasma etcher 105 and edge ring 125 described herein. As shown in FIG. 3A, edge ring 125 may receive a radio frequency (RF) current from a power supply (e.g., from the high bias voltage power supply shown in FIG. 1A). A capacitance (C) generated by edge ring 125 based on the RF current may be determined by:

$$C = \varepsilon_0 \varepsilon_r \frac{S}{d},$$

where $\varepsilon_0$ may correspond to a constant value (e.g., permittivity of free space), $\varepsilon_r$ may correspond to an absolute permittivity of the material of edge ring 125, S may correspond to an area of edge ring 125, and d may correspond to height 170 of edge ring 125. An impedance (Z) generated by edge ring 125 may be determined by:

$$Z = \frac{R}{1 + \omega CR},$$

where R may correspond to a resistance of the material of edge ring 125 and ω may correspond to 2*π*frequency of the RF current. Thus, as height 170 of edge ring 125 (d) is increased, the capacitance (C) is reduced, which increases the impedance (Z) generated by edge ring 125, as indicated by reference number 310 in FIG. 3A. The increased impedance reduces sensitivity of edge ring 125 to the plasma etching process and reduces an erosion rate of edge ring 125.

Figure 3B:
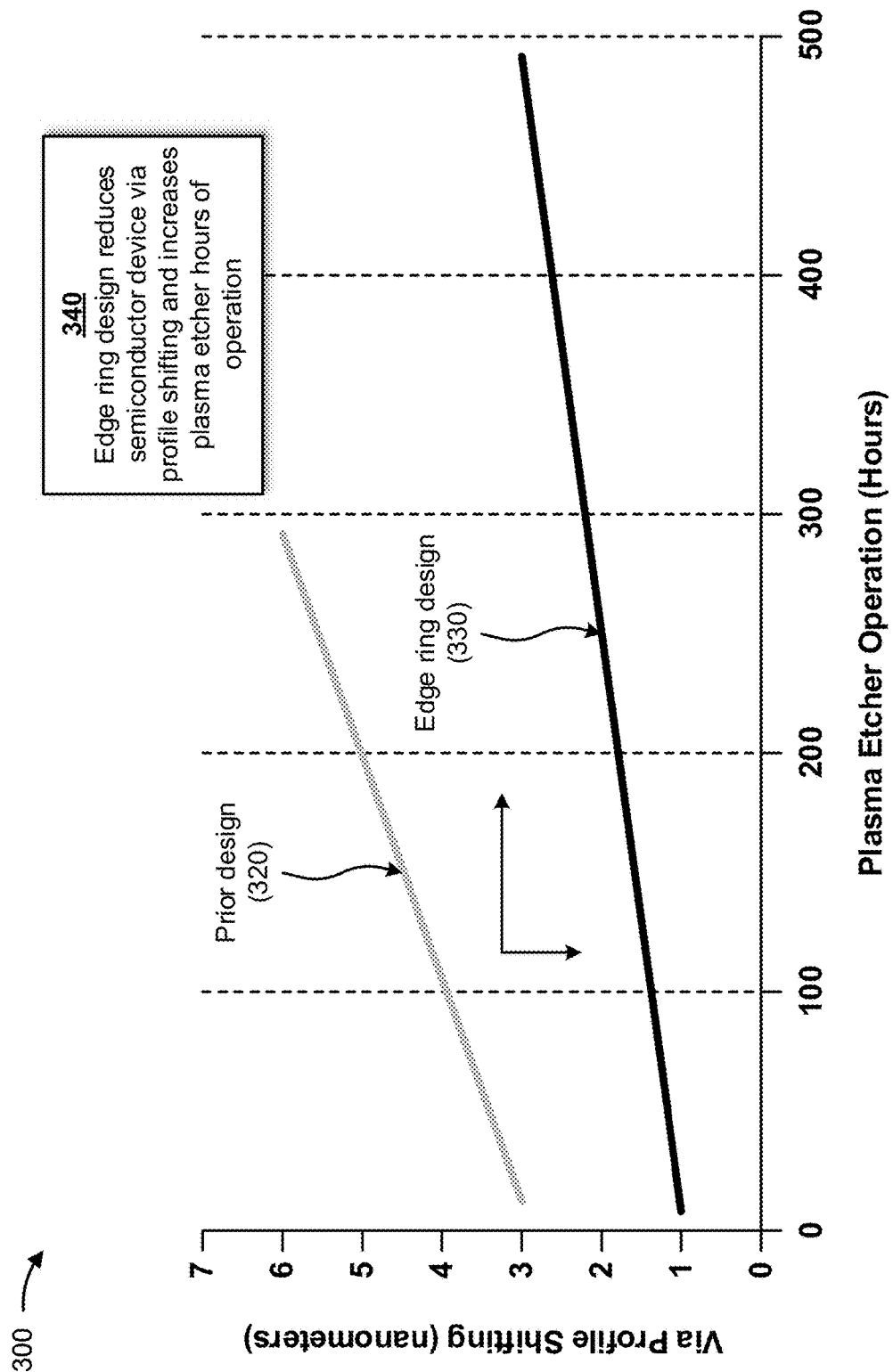

As shown in FIG. 3B, a graph may compare via profile shifting (e.g., in nanometers and as described above in connection with FIG. 2) and plasma etcher 105 hours of operation for a prior design 320 (e.g., designs of current edge rings described above) and an edge ring design 330 (e.g., design of edge ring 125). As further shown, and by reference number 340, edge ring design 330 reduces via profile shifting for semiconductor device 110 and increases plasma etcher 105 hours of operation compared to prior design 320. For example, a line representing edge ring design 330 is shifted downward (e.g., reducing via profile shifting) and to the right (e.g., increasing plasma etcher 105 hours of operation) as compared to a line representing prior design 320.

Figure 3C:
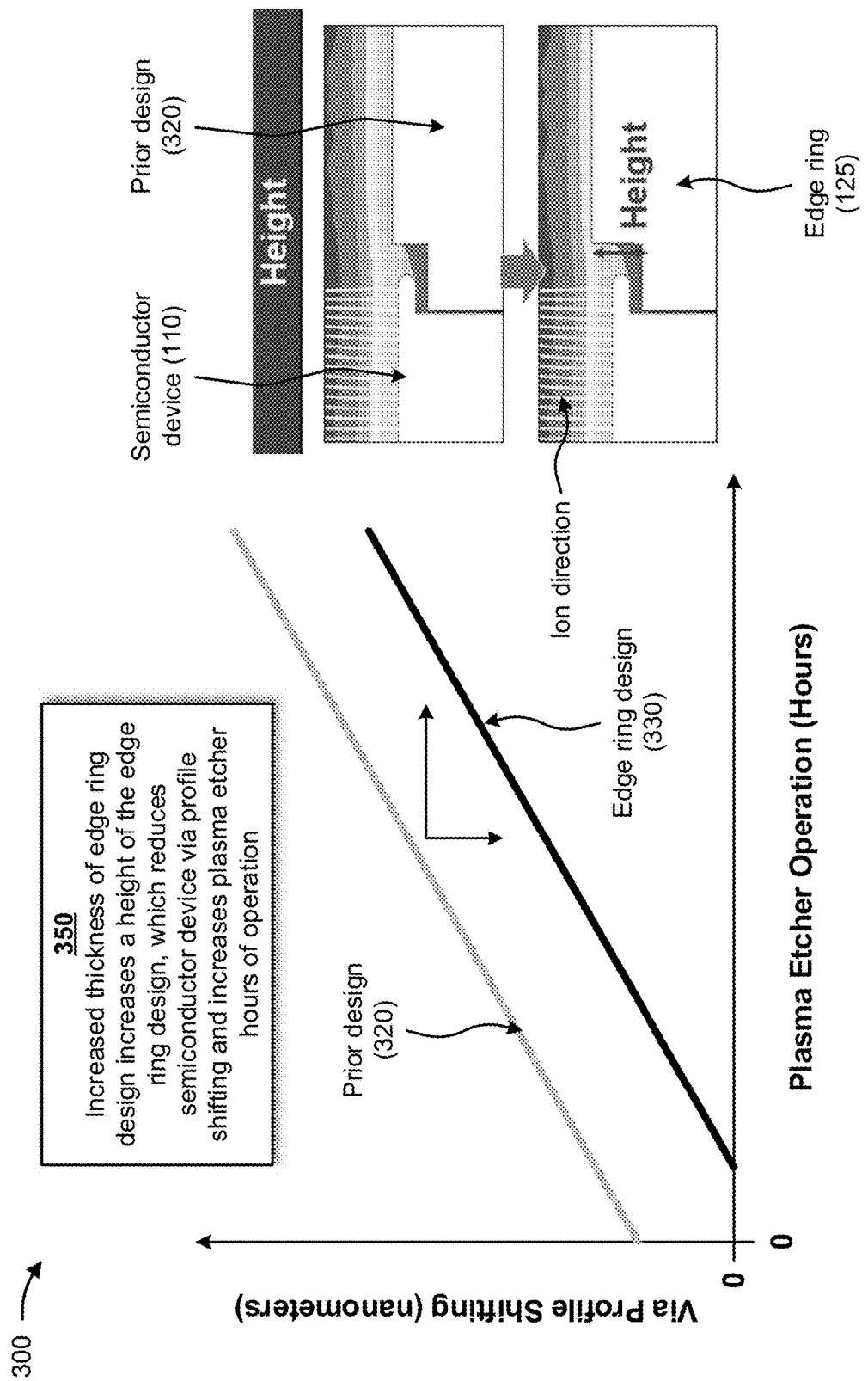

As shown to the left in FIG. 3C, a graph may compare via profile shifting and plasma etcher 105 hours of operation for prior design 320 and edge ring design 330. As further shown, and by reference number 350, an increased thickness of edge ring design 330 (e.g., thickness 175 of FIG. 1D) increases a height of edge ring design 330, which reduces via profile shifting of semiconductor device 110 and increases hours of operation for plasma etcher 105. For example, a line representing edge ring design 330 is shifted downward (e.g., reducing via profile shifting) and to the right (e.g., increasing plasma etcher 105 hours of operation) as compared to a line representing prior design 320. The right in FIG. 3C shows examples of simulations of ion direction of the plasma of plasma etcher 105 for prior design 320 and edge ring design 330. As shown, the ion direction of the plasma for edge ring design 330 is outward from a center of semiconductor device 110, which aids in controlling plasma coverage of semiconductor device 110, reducing via profile shifting of semiconductor device 110, and increasing hours of operation for plasma etcher 105.

Figure 3D:
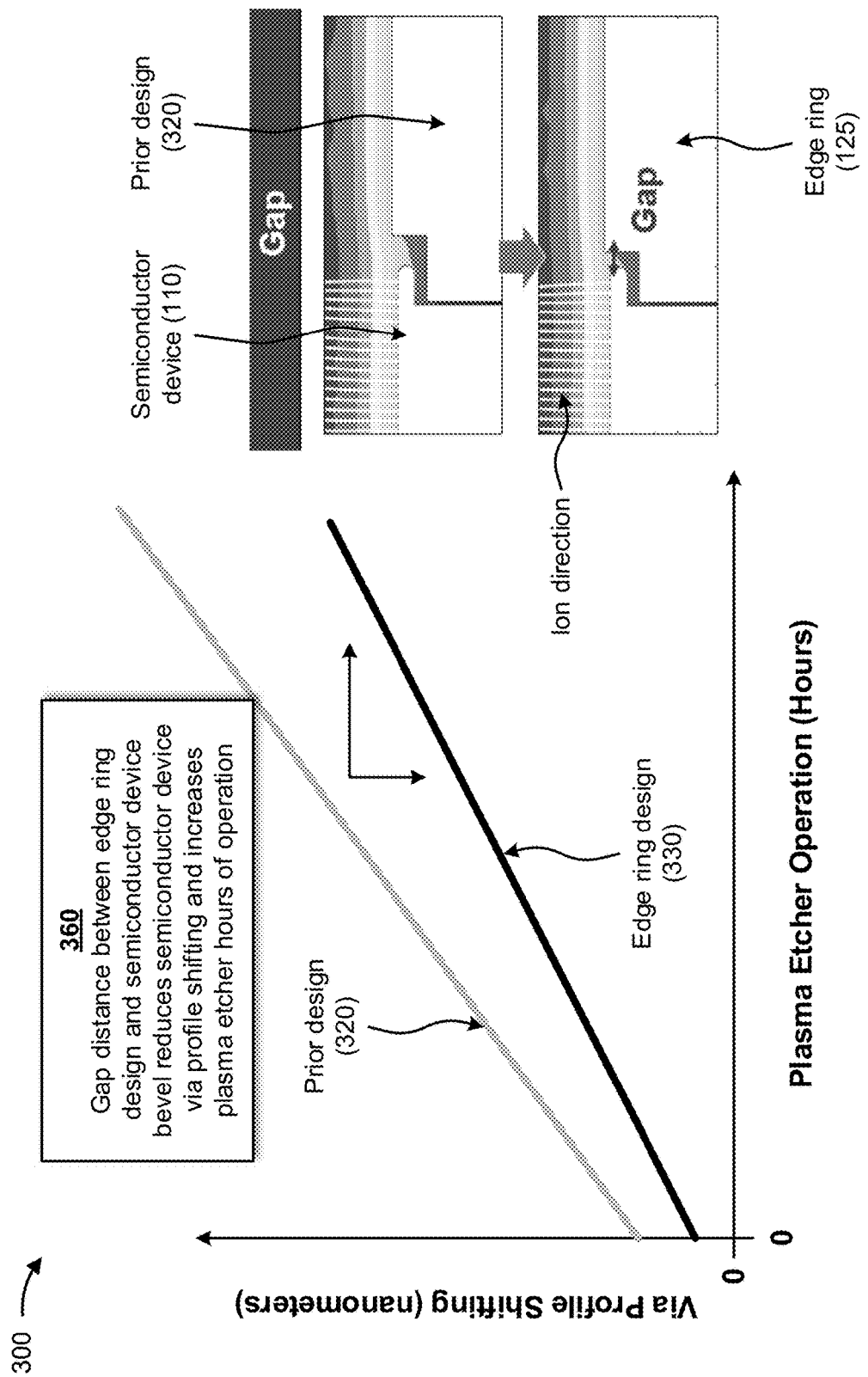

As shown to the left in FIG. 3D, a graph may compare via profile shifting and plasma etcher 105 hours of operation for prior design 320 and edge ring design 330. As further shown, and by reference number 360, a gap distance between edge ring design 330 and an edge of semiconductor device 110 (e.g., gap 165 of FIG. 1D) reduces via profile shifting of semiconductor device 110 and increases hours of operation for plasma etcher 105. For example, a line representing edge ring design 330 is shifted downward (e.g., reducing via profile shifting) and to the right (e.g., increasing plasma etcher 105 hours of operation) as compared to a line representing prior design 320. The right in FIG. 3D shows examples of simulations of ion direction of the plasma of plasma etcher 105 for prior design 320 and edge ring design 330. As shown, the ion direction of the plasma for edge ring design 330 is outward from a center of semiconductor device 110, which aids in controlling plasma coverage of semiconductor device 110, reducing via profile shifting of semiconductor device 110, and increasing hours of operation for plasma etcher 105.

Figure 3E:
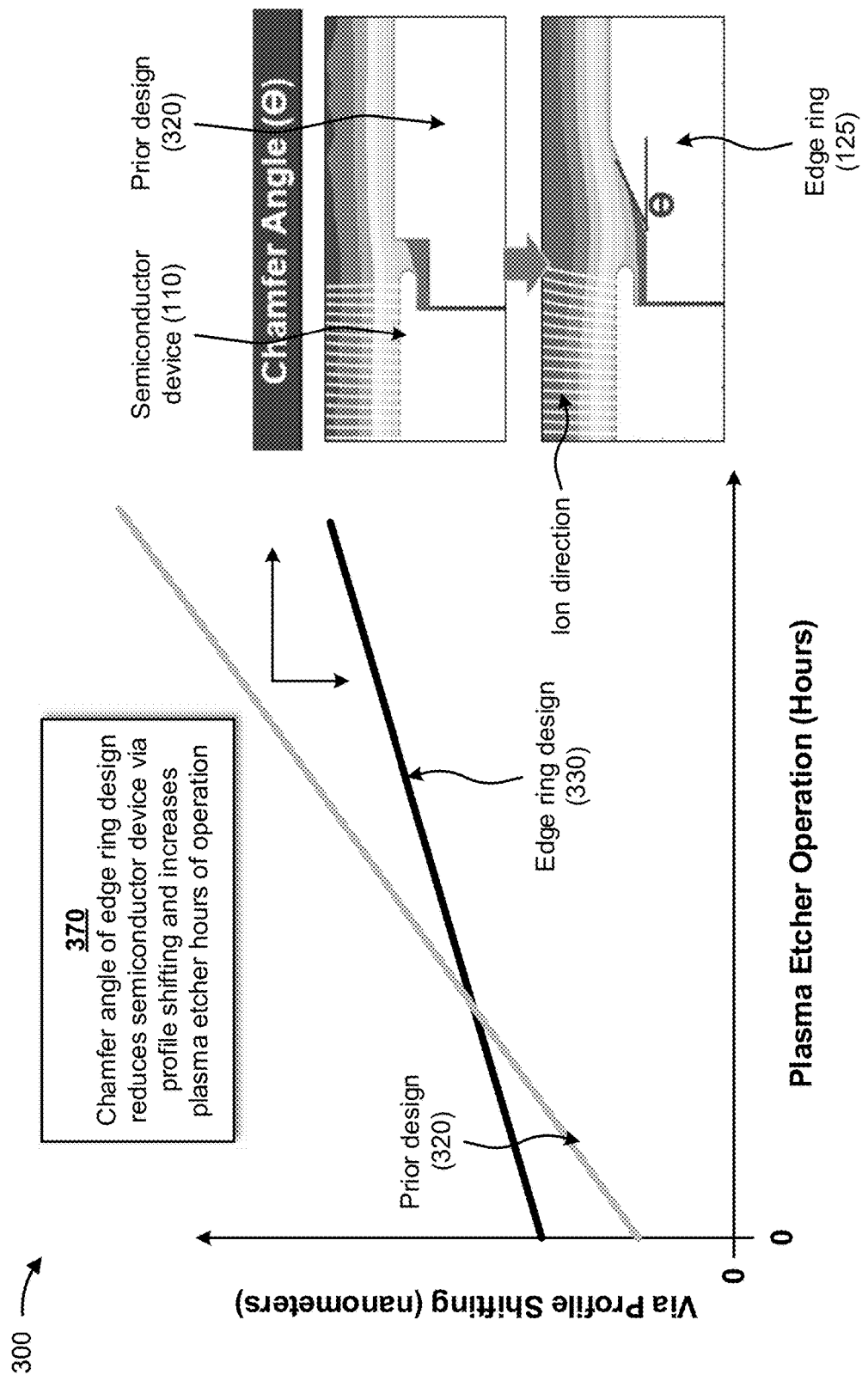

As shown to the left in FIG. 3E, a graph may compare via profile shifting and plasma etcher 105 hours of operation for prior design 320 and edge ring design 330. As further shown, and by reference number 370, a chamfer angle of edge ring design 330 (e.g., angle θ of FIG. 1D) reduces via profile shifting of semiconductor device 110 and increases hours of operation for plasma etcher 105. For example, a line representing edge ring design 330 is shifted downward (e.g., reducing via profile shifting) and to the right (e.g., increasing plasma etcher 105 hours of operation) as compared to a line representing prior design 320. The right in FIG. 3E shows examples of simulations of ion direction of the plasma of plasma etcher 105 for prior design 320 and edge ring design 330. As shown, the ion direction of the plasma for edge ring design 330 is inward to a center of semiconductor device 110, which aids in controlling plasma coverage of semiconductor device 110, reducing via profile shifting of semiconductor device 110, and increasing hours of operation for plasma etcher 105.

Although FIGS. 3C-3E depict benefits associated with thickness 175, gap 165, and angle θ of edge ring 125 individually, in some implementations thickness 175, gap 165, and angle θ may be used individually or in any combination with edge ring 125 to achieve the benefits depicted in these figures.

As indicated above, FIGS. 3A-3E are provided merely as one or more examples. Other examples may differ from what is described with regard to FIGS. 3A-3E.

Figure 4:
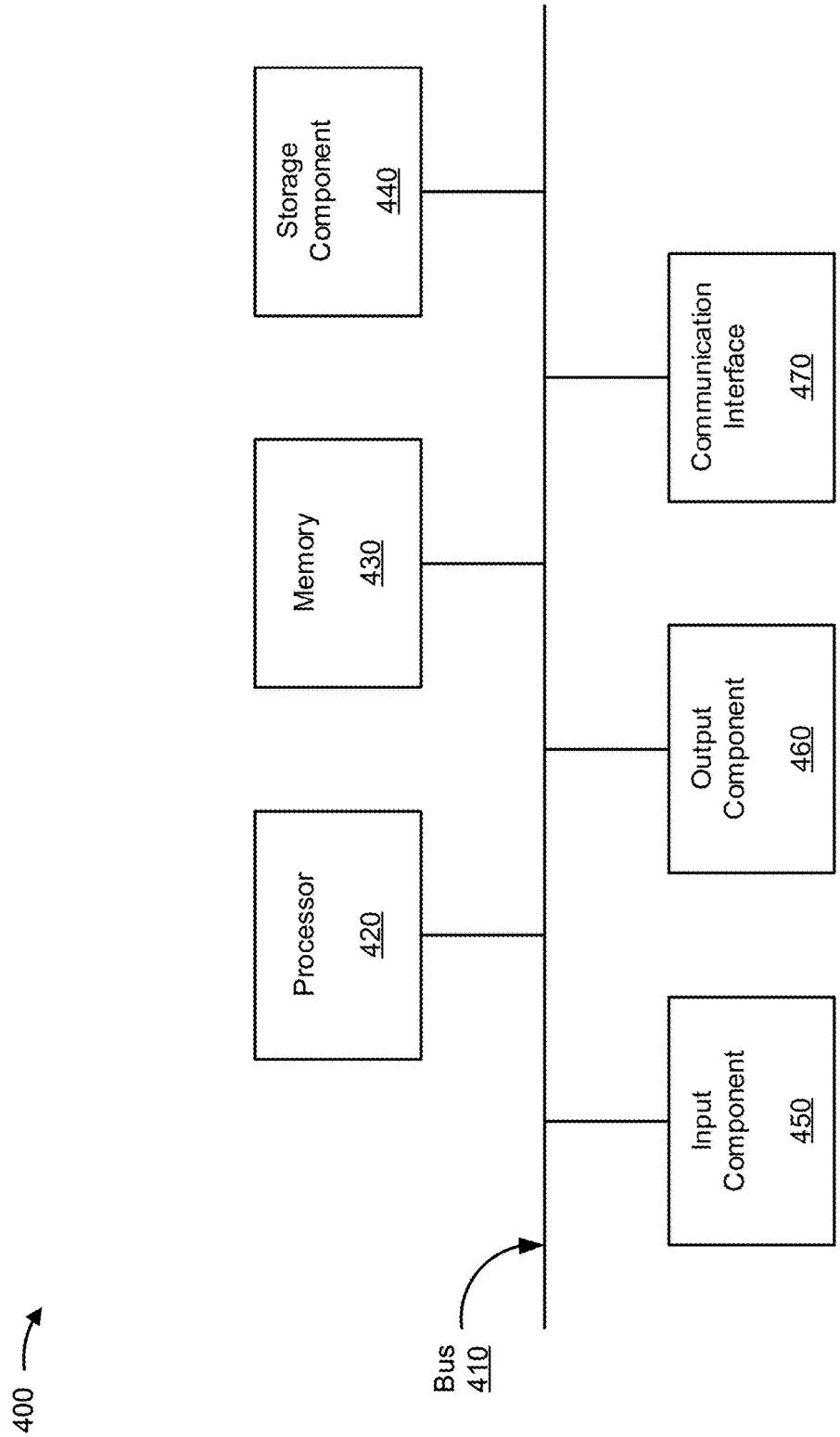
FIG. 4 is a diagram of example components of the plasma etcher of FIG. 1.

FIG. 4 is a diagram of example components of a device 400, which may correspond to plasma etcher 105. In some implementations, plasma etcher 105 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory), a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, an actuator, and/or the like. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, an antenna, and/or the like.

Device 400 may perform one or more processes described herein. For example, a non-transitory computer-readable medium (e.g., memory 430 and/or storage component 440) may store a set of instructions (e.g., one or more instructions, code, software code, program code, and/or the like) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
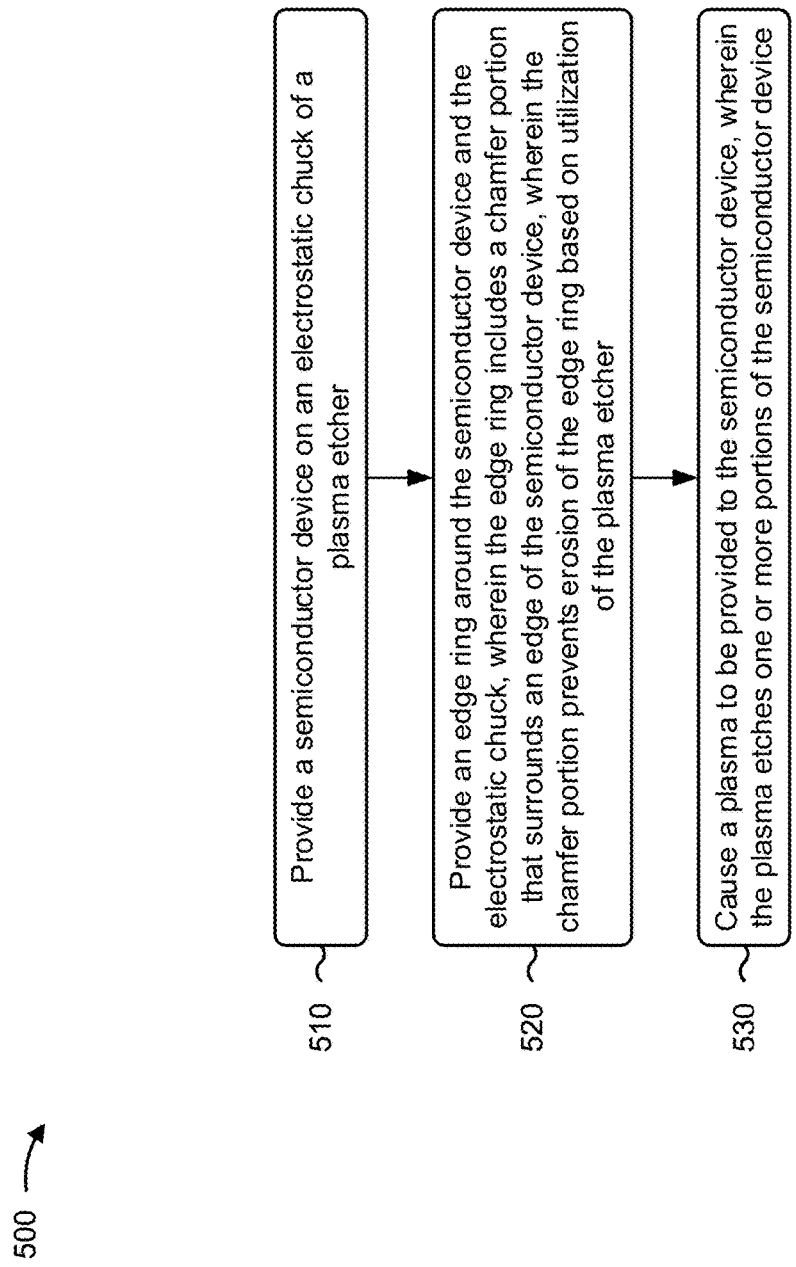
FIG. 5 is a flowchart of an example process for generating a semiconductor device with a plasma etcher and an edge ring with a chamfer geometry and impedance design.

FIG. 5 is a flow chart of an example process 500 for generating a semiconductor device (e.g., the semiconductor device described herein and/or other types of semiconductor devices) with a plasma etcher and an edge ring with a chamfer geometry and impedance design. In some implementations, one or more process blocks of FIG. 5 may be performed by a device (e.g., plasma etcher 105). In some implementations, one or more process blocks of FIG. 5 may be performed by another device or a group of devices separate from or including the device. Additionally, or alternatively, one or more process blocks of FIG. 5 may be performed by one or more components of device 400, such as processor 420, memory 430, storage component 440, input component 450, output component 460, communication interface 470, and/or the like.

As shown in FIG. 5, process 500 may include providing a semiconductor device on an electrostatic chuck of the plasma etcher (block 510). For example, a semiconductor device 110 may be provided on an electrostatic chuck 120 of the plasma etcher 105, as described above.

As further shown in FIG. 5, process 500 may include providing an edge ring around the semiconductor device and the electrostatic chuck, wherein the edge ring includes a chamfer portion that surrounds an edge of the semiconductor device, wherein the chamfer portion prevents erosion of the edge ring based on utilization of the plasma etcher (block 520). For example, an edge ring 125 may be provided around the semiconductor device 110 and the electrostatic chuck 120, as described above. In some implementations, the edge ring 125 includes a chamfer portion 160 that surrounds an edge of the semiconductor device 110. In some implementations, the chamfer portion 160 prevents erosion of the edge ring 125 based on utilization of the plasma etcher 105.

As further shown in FIG. 5, process 500 may include causing a plasma to be provided to the semiconductor device, wherein the plasma etches one or more portions of the semiconductor device (block 530). For example, a plasma may be provided to the semiconductor device 110, as described above. In some implementations, the plasma etches one or more portions of the semiconductor device 110.

Process 500 may include additional implementations, such as any single implementation or any combination of implementations described below and/or in connection with one or more other processes described elsewhere herein.

In a first implementation, process 500 includes providing a high bias voltage to the edge ring 125 while the plasma is provided to the semiconductor device 110.

In a second implementation, alone or in combination with the first implementation, the chamfer portion 160 controls an ion angle effect associated with ions of the plasma.

In a third implementation, alone or in combination with one or more of the first and second implementations, the chamfer portion 160 includes an inner surface that is angled radially outward, from the edge of the semiconductor device 110, in a range from approximately thirty degrees to approximately fifty degrees.

In a fourth implementation, alone or in combination with one or more of the first through third implementations, a distance between the edge of the semiconductor device 110 and an inner surface of the chamfer portion 160 is in a range from approximately zero millimeters to approximately two millimeters.

In a fifth implementation, alone or in combination with one or more of the first through fourth implementations, the chamfer portion 160 includes an inner surface that is angled radially outward, from the edge of the semiconductor device 110, at less than ninety degrees.

In a sixth implementation, alone or in combination with one or more of the first through fifth implementations, the inner surface is angled in a range from approximately ten degrees to approximately seventy degrees.

In a seventh implementation, alone or in combination with one or more of the first through sixth implementations, a distance between a top surface of the semiconductor device 110 and a top surface of the circular top portion 155 is in a range from approximately zero millimeters to approximately 1.5 millimeters.

In an eighth implementation, alone or in combination with one or more of the first through seventh implementations, a distance between a top surface of the semiconductor device 110 and a top surface of the circular top portion 155 is in a range from approximately zero millimeters to approximately 3.75 millimeters.

In a ninth implementation, alone or in combination with one or more of the first through eighth implementations, a distance between an edge of the semiconductor device 110 and the inner surface of the circular chamfer portion 160 is in a range from approximately zero millimeters to approximately four millimeters.

In a tenth implementation, alone or in combination with one or more of the first through ninth implementations, a thickness of the circular bottom portion 150 and a thickness of the circular top portion 155 define a height of the edge ring 125, and the height of the edge ring 125 impacts an impedance of the edge ring 125.

In an eleventh implementation, alone or in combination with one or more of the first through tenth implementations, the plasma etcher 105 includes a plasma sheath 130 to cause the plasma gas to remain near a top surface of the semiconductor device 110.

In a twelfth implementation, alone or in combination with one or more of the first through eleventh implementations, the plasma etcher 105 includes a high bias voltage power supply to provide a high bias voltage to the edge ring 125.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, the design of edge ring 125 increases an impedance generated by edge ring 125, which reduces sensitivity of edge ring 125 to the plasma etching process and reduces an erosion rate of edge ring 125 relative to current edge ring designs. The reduced erosion rate enables plasma etcher 105 to operate for longer periods of time, increases manufacturing throughput, and reduces replacement costs associated with operating plasma etcher 105. Furthermore, chamfer portion 160 of edge ring 125 improves control of a plasma ion angle effect of plasma etcher 105 and ensures that the plasma contacts semiconductor device 110 during the plasma etch. This reduces process sensitivity and improves quality control for semiconductor device 110 by preventing vias 230 of semiconductor device 110 from unwantedly shifting during the plasma etching process.

As described in greater detail above, some implementations described herein provide an edge ring for a plasma etcher. The edge ring may include a circular bottom portion with an opening sized to receive an electrostatic chuck supporting a semiconductor device, and a circular top portion integrally connected to a first top part of the circular bottom portion. The edge ring may include a circular chamfer portion integrally connected to a second top part of the circular bottom portion and integrally connected to a side of the circular top portion. The circular chamfer portion may include an inner surface that is angled radially outward from the opening at less than ninety degrees.

As described in greater detail above, some implementations described herein provide a method of processing a semiconductor device with a plasma etcher. The method may include providing the semiconductor device on an electrostatic chuck of the plasma etcher, and providing an edge ring around the semiconductor device and the electrostatic chuck. The edge ring may include a chamfer portion that surrounds an edge of the semiconductor device, and the chamfer portion may prevent erosion of the edge ring based on utilization of the plasma etcher. The method may include causing a plasma to be provided to the semiconductor device, wherein the plasma may etch one or more portions of the semiconductor device.

As described in greater detail above, some implementations described herein provide a plasma etcher. The plasma etcher may include a chamber, and a plasma gas inlet attached to the chamber and to receive a plasma gas. The plasma etcher may include an electrostatic chuck provided in the chamber and to support a semiconductor device, and an edge ring provided in the chamber and to surround the electrostatic chuck and the semiconductor device. The edge ring may include a chamfer portion that is to surround an edge of the semiconductor device, and the chamfer portion may include an inner surface that is angled radially outward from the edge of the semiconductor device to prevent erosion of the edge ring by the plasma gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. An edge ring for a plasma etcher, the edge ring comprising:
   a circular bottom portion with an opening sized to receive an electrostatic chuck supporting a semiconductor device;
   a circular top portion integrally connected to a first top part of the circular bottom portion,
      wherein a distance between a top surface of the semiconductor device and a top surface of the circular top portion is in a range from approximately zero millimeters to approximately 3.75 millimeters, and
      wherein the distance between the top surface of the semiconductor device and the top surface of the circular top portion is less than a distance between the top surface of the circular top portion and a top surface of the circular bottom portion; and a circular chamfer portion integrally connected to a second top part of the circular bottom portion and integrally connected to a side of the circular top portion,
wherein the circular chamfer portion includes an inner surface that is angled radially outward from the opening at less than ninety degrees, and
wherein the inner surface extends below the top surface of the semiconductor device to connect to the top surface of the circular bottom portion.

2. The edge ring of claim 1, wherein the inner surface is angled in a range from approximately thirty degrees to approximately fifty degrees.

3. The edge ring of claim 1, wherein the inner surface is angled in a range from approximately ten degrees to approximately seventy degrees.

4. The edge ring of claim 1, wherein the distance between the top surface of the semiconductor device and the top surface of the circular top portion is in a range from approximately zero millimeters to approximately 1.5 millimeters.

5. The edge ring of claim 1, wherein a distance between an edge of the semiconductor device and the inner surface is in a range from approximately zero millimeters to approximately two millimeters.

6. The edge ring of claim 1, wherein a distance between an edge of the semiconductor device and the inner surface is in a range from approximately zero millimeters to approximately four millimeters.

7. The edge ring of claim 1, wherein a thickness of the circular bottom portion and a thickness of the circular top portion define a height of the edge ring,
wherein the height of the edge ring impacts an impedance of the edge ring.

8. The edge ring of claim 1, wherein the top surface of the circular bottom portion extends underneath the semiconductor device in a plan view.

9. A method of processing a semiconductor device with a plasma etcher, the method comprising:
providing the semiconductor device on an electrostatic chuck of the plasma etcher;
providing an edge ring around the semiconductor device and the electrostatic chuck, wherein the edge ring includes:
a circular bottom portion with an opening sized to receive the electrostatic chuck,
a circular top portion integrally connected to a first top part of the circular bottom portion,
wherein a distance between a top surface of the semiconductor device and a top surface of the circular top portion is in a range from approximately zero millimeters to approximately 3.75 millimeters, and
wherein the distance between the top surface of the semiconductor device and the top surface of the circular top portion is less than a distance between the top surface of the circular top portion and a top surface of the circular bottom portion, and
a chamfer portion integrally connected to a second top part of the circular bottom portion and integrally connected to a side of the circular top portion,
wherein the chamfer portion includes an inner surface that is angled radially outward from the opening at less than ninety degrees,
wherein the inner surface extends below the top surface of the semiconductor device to connect to the top surface of the circular bottom portion,
wherein the chamfer portion surrounds an edge of the semiconductor device, and
wherein the chamfer portion prevents erosion of the edge ring based on utilization of the plasma etcher; and
causing a plasma to be provided to the semiconductor device,
wherein the plasma etches one or more portions of the semiconductor device.

10. The method of claim 9, further comprising:
providing a high bias voltage to the edge ring while the plasma is provided to the semiconductor device.

11. The method of claim 9, wherein the chamfer portion controls an ion angle effect associated with ions of the plasma.

12. The method of claim 9, wherein the inner surface is angled in a range from approximately thirty degrees to approximately fifty degrees.

13. The method of claim 9, wherein a distance between the edge of the semiconductor device and the inner surface is in a range from approximately zero millimeters to approximately two millimeters.

14. The method of claim 9, wherein the inner surface is angled radially outward, from the edge of the semiconductor device, at less than ninety degrees.

15. A plasma etcher, comprising:
a chamber;
a plasma gas inlet attached to the chamber and to receive a plasma gas;
an electrostatic chuck provided in the chamber and to support a semiconductor device; and
an edge ring provided in the chamber and to surround the electrostatic chuck and the semiconductor device,
wherein the edge ring includes:
a circular bottom portion with an opening sized to receive the electrostatic chuck,
a circular top portion integrally connected to a first top part of the circular bottom portion,
wherein a distance between a top surface of the semiconductor device and a top surface of the circular top portion is in a range from approximately zero millimeters to approximately 3.75 millimeters, and
wherein the distance between the top surface of the semiconductor device and the top surface of the circular top portion is less than a distance between the top surface of the circular top portion and a top surface of the circular bottom portion, and
a chamfer portion integrally connected to a second top part of the circular bottom portion and integrally connected to a side of the circular top portion,
wherein the chamfer portion is arranged to surround an edge of the semiconductor device,
wherein the chamfer portion includes an inner surface that is angled radially outward from the edge of the semiconductor device to prevent erosion of the edge ring by the plasma gas, and
wherein the inner surface extends below the top surface of the semiconductor device to connect to the top surface of the circular bottom portion.

16. The plasma etcher of claim 15, wherein the inner surface is angled in a range from approximately thirty degrees to approximately fifty degrees.

17. The plasma etcher of claim 15, wherein the distance between the top surface of the semiconductor device and a top surface of the edge ring is in a range from approximately zero millimeters to approximately 1.5 millimeters.

18. The plasma etcher of claim 15, wherein a distance between the edge of the semiconductor device and the inner surface is in a range from approximately zero millimeters to approximately two millimeters.

19. The plasma etcher of claim 15, further comprising:
a plasma sheath to cause the plasma gas to remain near the top surface of the semiconductor device.

20. The plasma etcher of claim 15, further comprising:
a high bias voltage power supply to provide a high bias voltage to the edge ring.

* * * * *